United States Patent [19]
Suzuki

[11] Patent Number: 5,598,029
[45] Date of Patent: Jan. 28, 1997

[54] POWER SUPPLY WIRING FOR SEMICONDUCTOR DEVICE

[75] Inventor: Kazumasa Suzuki, Tokyo, Japan

[73] Assignee: NEC Corporation, Tokyo, Japan

[21] Appl. No.: 305,392

[22] Filed: Sep. 13, 1994

[30] Foreign Application Priority Data

Sep. 13, 1993 [JP] Japan ................................ 5-227380

[51] Int. Cl.[6] ............................. H01L 23/58; H01L 23/62
[52] U.S. Cl. ........................... 257/665; 257/532; 257/758; 257/760
[58] Field of Search .................................. 257/760, 532, 257/533, 665, 758

[56] References Cited

U.S. PATENT DOCUMENTS

| | | | |
|---|---|---|---|
| 4,654,689 | 3/1987 | Fujii | 357/51 |
| 4,737,830 | 4/1988 | Patel et al. | 357/23.6 |
| 4,825,276 | 4/1989 | Kobayashi | 357/45 |

FOREIGN PATENT DOCUMENTS

| | | |
|---|---|---|
| 0154998 | 9/1985 | European Pat. Off. . |
| 0230154 | 7/1987 | European Pat. Off. . |
| 0250269 | 12/1987 | European Pat. Off. . |
| 62-237756 | 10/1987 | Japan . |
| 01065864 | 3/1989 | Japan . |
| 2-144936 | 9/1990 | Japan . |

OTHER PUBLICATIONS

Patent Abstracts of Japan, vol. 13, No. 277, 26 Jun. 1989.
Digest of Technical Papers, 1990 IEEE International Solid–State Circuits Conference, pp. 48, 263 and slide supplement, p. 36 No Month.

Primary Examiner—Sara W. Crane
Assistant Examiner—David Ostrowski
Attorney, Agent, or Firm—Sughrue, Mion, Zinn, Macpeak & Seas

[57] ABSTRACT

Ground lines 2 are disposed so as to sandwich a power supply line 1. A gate oxide film 3 and a gate 4 are formed below the power supply line 1. An n-type area 8 is formed adjacent to the end of the gate oxide film to set the ground potential thereto. A p-type area 9 is formed at most of the remaining part below the ground line to make it contact the substrate. Since the potential of the gate equals that of the power source, an inversion layer is formed below the oxide film, where the ground potential results through the n-type area. By sandwiching the gate oxide film between the gate and the inversion layer, a capacitor is formed. The size of the capacitor is half in length as large as the width of the power supply wiring, and the width substantially equals the length of the power supply wiring, the parasitic resistance generated at the gate or inversion layer is suppressed small, and the gate capacitance approximately corresponding to the area of master power supply wiring is interposed between the power source and the ground. As a result, a large capacitance bypass capacitor can be formed between the power source and the ground, and a power supply wiring which is great in effect of eliminating power supply noise can be obtained.

34 Claims, 4 Drawing Sheets

POWER SUPPLY WIRING FOR SEMICONDUCTOR DEVICE

FIELD OF THE INVENTION

The present invention relates to a power supply wiring for a semiconductor device and, in particular, to a power supply wiring which pays attention to the reduction of noise of a semi-conductor integrated circuit device which requires high speed operation.

BACKGROUND OF THE INVENTION

In a CMOS circuit, current flows therethrough when the output value changes. In particular, if the CMOS circuit is operated at a fast speed, then the current is increased, and a large current will flow in a short period of time. This current causes noise to be generated at the power supply line and the ground line. In order to reduce the noise, a bypass capacitor may be connected between the power source and the ground to supply electric charges thereto.

In Japanese Patent Application Laid-Open No. 62-237756 ("MOS Integrated Circuit"), there is disclosed a method of forming the foregoing bypass capacitor on a semiconductor chip. This is intended for forming the bypass capacitor between a power supply line 1 and a substrate, that is, a chip 10 by forming an oxide film 3, which is similar to the gate oxide film, below the power supply line 1 lying on the chip 10, as shown in FIG. 1. However, in the conventional process of making the CMOS integrated circuit, since an electrically conductive film is formed on the gate oxide film by using polysilicon or polycide, which is high in resistivity, if only the oxide film similar to the gate oxide film is formed below the power supply line made of the polysilicon or polycide, parasitic resistance is increased and the effect of eliminating noise becomes low.

In Japanese Patent Application Laid-Open No. 2-144936 ("Semiconductor Integrated Circuit Device"), there is disclosed a method of forming a bypass capacitor in the wiring area of the gate array. This is intended for forming the gate oxide film 3 in the wiring area 11, on which the gate 4 is formed, as shown in FIG. 2. The area of the gate oxide film is made to extend up to the power supply line 1 to be connected through a contact 5 to the power source while the gate is made to extend up to the ground line 2 to be connected to the ground. A portion where the gate oxide film and the gate are overlapped forms a capacitor, which forms the bypass capacitor. However, since the wiring area of the gate array is wide, the parasitic resistance of the gate oxide film area and the gate is still increased, and the effect of eliminating the noise is low. Further, in an entirely laid-out gate array which provides no special wiring area, this method cannot be used.

In the proceedings of the 1990 IEEE International Solid-State Circuit Conference, page 48, left column, third paragraph and the slide supplement, page 36, there is described a method of suppressing the parasitic resistance sufficiently small by connecting the capacitor similar in construction to the MOS transistor, in which the size of the gate 4 is limited to 12.5 μm in width (corresponding to the channel length) and 150 μm in length, to the nMOS transistor in parallel, as shown in FIG. 3, and by applying power source potential to the gate and ground potential to the source/drain. This is intended for determining the configuration of the capacity area made of the gate 4 and the gate oxide film 3 so that the area and the time constant become optimal. However, in the case of this size, if they are accommodated below the power supply wiring, it is necessary to set the width of the power supply wiring to more than 150 μm. Further, since the gate electrode is thin such as 12.5 μm in width, there is a possibility that it cannot cope with more higher operating speed in the future when the sheet resistance of the gate layer is high.

SUMMARY OF THE INVENTION

Accordingly, an object of the present invention is to provide a bypass capacitor formed on the chip which is very effective to remove the noise generated at the power supply wiring by laying it out so that the parasitic capacitor can be made smaller. That is, the object of the present invention is to provide a power supply wiring capable of effectively eliminating the power supply noise.

The present invention also aims at providing a power supply wiring which is very effective to supply a sufficiently large current.

According to the present invention, in order to achieve the foregoing end, there is provided a power supply wiring adapted for semiconductor device comprising:

at least one first power supply line structure and at least two second power supply line structures, which are disposed adjacent to both sides of the first power supply line structure;

the first power supply line structure comprising a capacitance forming insulating film formed on a semiconductor substrate, a capacitance forming electrically conductive film on said capacitance forming insulating film and a first power supply line formed on the capacitance forming electrically conductive film via a first insulating layer and electrically connected to the capacitance forming electrically conductive film through through hole of the first insulating layer;

the second power supply line structures each comprising a second power supply line formed on the semiconductor substrate via a second insulating layer and electrically connected to the semiconductor substrate through through hole of the second insulating layer.

A plurality of first power supply line structures and a plurality of second power supply line structures may be alternately disposed.

A plurality of through holes of the first insulating layer may be formed at the substantially central portion of the first power supply line structure relative to the width direction thereof.

The through holes of the first insulating layer may be disposed at an interval smaller than the substantially the same distance as the width of the first power supply line structure in the direction in which the first power supply line structure extends.

The capacitance forming insulating film may comprise silicon oxide.

The capacitance forming electrically conductive film may comprise polysilicon or polycide.

The first and second insulating layers may be made of silicon oxide.

The first and second power supply lines may be made of metal such as aluminum or aluminum alloy.

The first power supply line may include a first metal layer formed on the capacitance forming electrically conductive film via the first insulating layer and electrically connected to the capacitance forming electrically conductive film through through hole of the first insulating layer and a second metal layer formed on the first metal layer via a first additional insulating layer and elecctrically connected to the first metal layer through through hole of the first additional insulating layer.

A plurality of through holes of the first additional insulating layer may be disposed at an interval substantially equal to that at which through holes of the first insulating layer are disposed.

The second power supply line structure may include a first electrically conductive type area formed on a surface portion of the semiconductor substrate, adjacent to the first power supply line structure, and the second power supply line may be electrically connected to the first electrically conductive type area.

The second power supply line structure may also include a second electrically conductive type area formed on another surface potion of the semiconductor substrate, and the second power supply line may be also electrically connected to the second electrically conductive type area.

The second power supply line may include a first metal layer formed on the semiconductor substrate via the second insulating layer and electrically connected to the semiconductor substrate through the through hole of the second insulating layer and a second metal layer formed on the first metal layer via a second additional insulating layer and electrically connected to the first metal layer through through hole of the second additional insulting layer.

The first and second power supply lines may lie at the substantially same level and their adjacent lateral end portions may be so close that they form a capacitance.

According to the present invention, in order to achieve the foregoing end, there is also provided a power supply wiring adapted for semiconductor integrated circuit device, wherein:

a second power supply line is disposed at both sides of a first power supply line, or the first and second power supply lines are alternately disposed, a gate electrode connected to the first power supply line and a gate insulating film are formed below the first power supply line, a first electrically conductive type area connected to the second power supply line is formed at an area adjacent to the gate electrode below the second power supply line, a second electrically conductive type area connected to the second power supply line is formed at another area, and a bypass capacitor is formed between the first and second power supply lines.

The interval between the first power supply line and the second power supply line may equal the minimum design dimension of a metal layer which is used for the power supply line.

The parasitic resistance can be suppressed small by shortening the length and thickening the width of the electrode of the bypass capacitor. Therefore, the width of the power supply line is thinned and a long gate electrode is formed on the entire surface therebelow, the second power supply lines are arranged in parallel to the first power supply line and thereby a bypass capacitor is formed so as to provide a wider and shorter electrode of the bypass capacitor, which allows the parasitic capacitance to be made smaller. Further, by alternately disposing the first and second power supply lines, an amount of current as much as one which flows through a thick power supply line can be supplied.

If the foregoing power supply wiring according to the present invention is used, then the gate capacitance which is about a half as large as the area of the master power supply line on a chip can be used as the bypass capacitor, and a large capacitance bypass capacitor can be formed between the power source and the ground. Further, since the value of the parasitic resistance which is connected to the bypass capacitor is small, the effect of eliminating the power supply noise is great.

DETAILED DESCRIPTION OF THE PREFERRED EMBODIMENTS

Specific embodiments of the present invention are hereinafter described with reference to the accompanying drawings.

Figure 1:
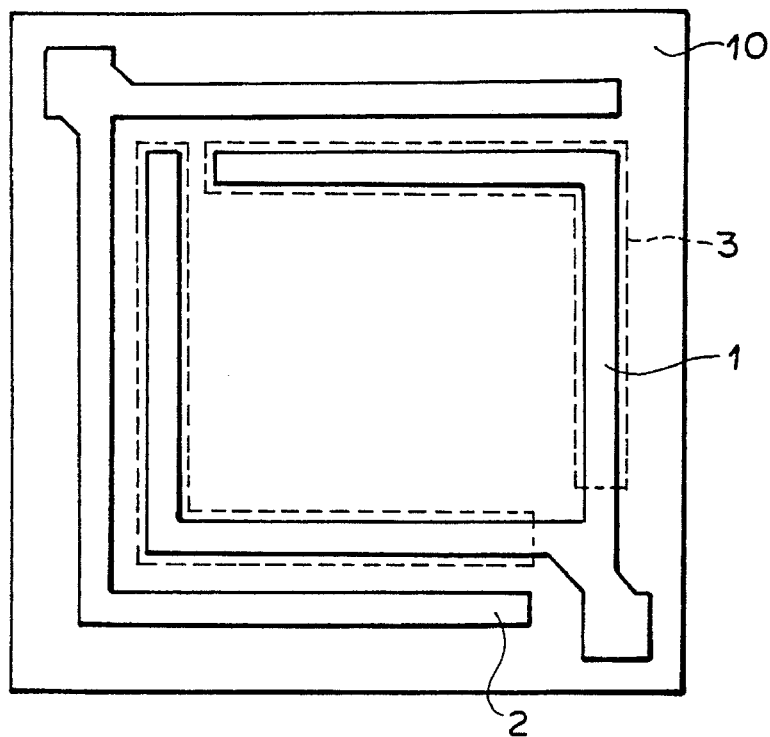
FIG. 1 is a view of a conventional bypass capacitor.
Figure 2:
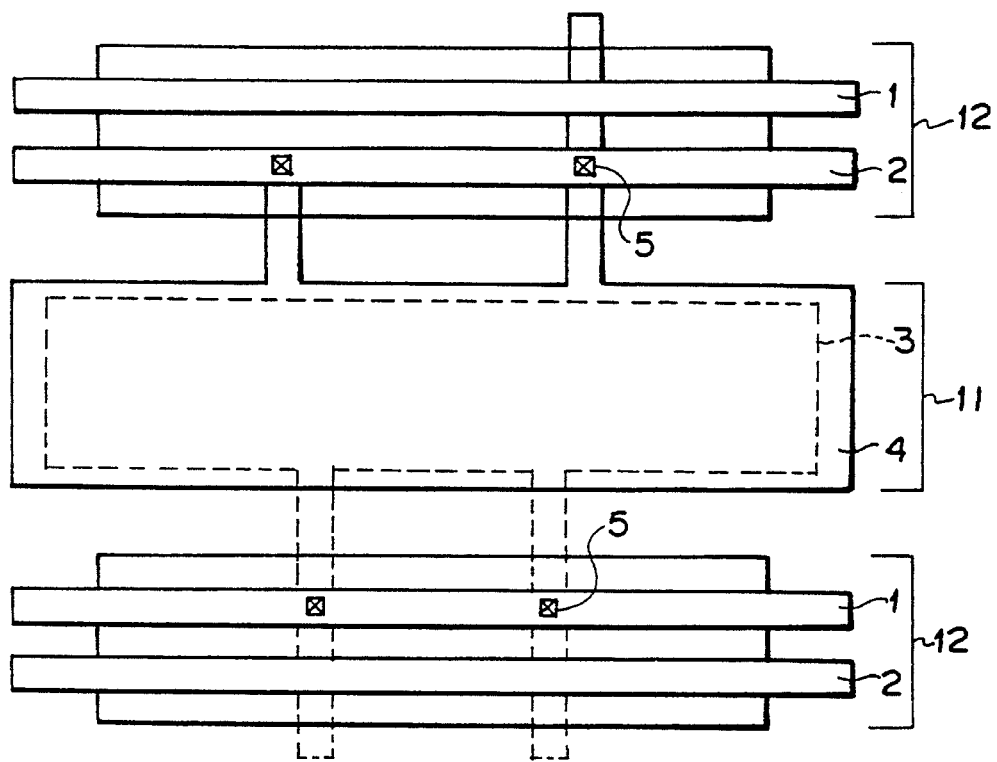
FIG. 2 is a view of another conventional bypass capacitor.
Figure 3:
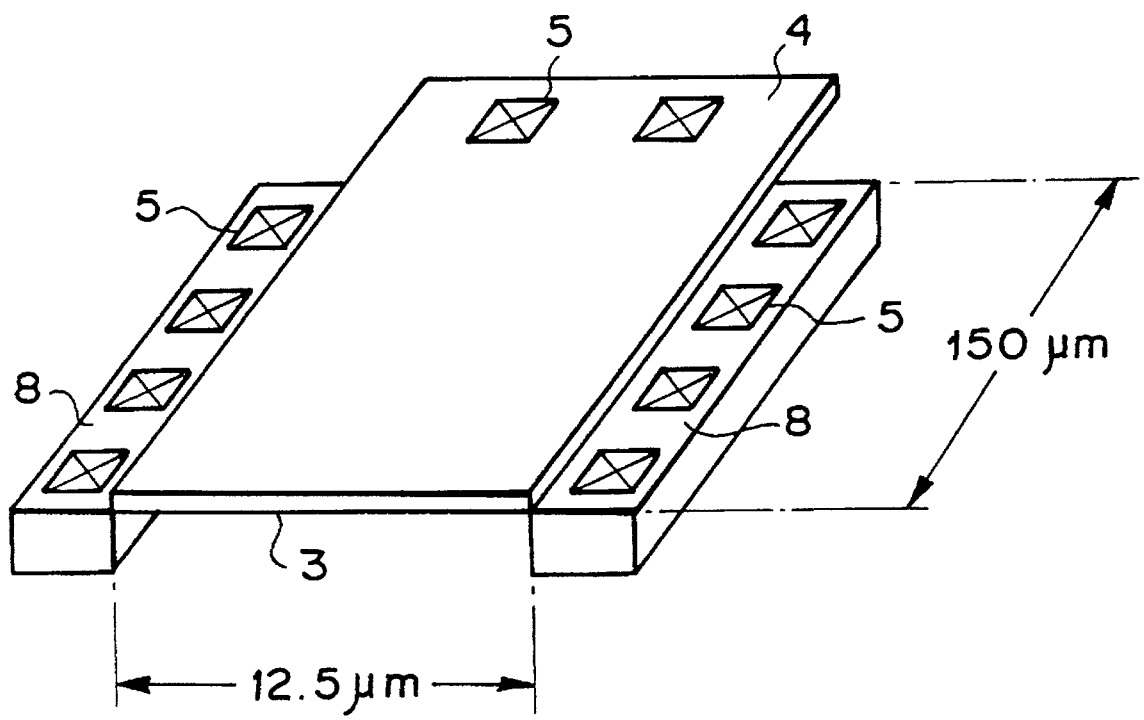
FIG. 3 is a view of still another conventional bypass capacitor.
Figure 4:
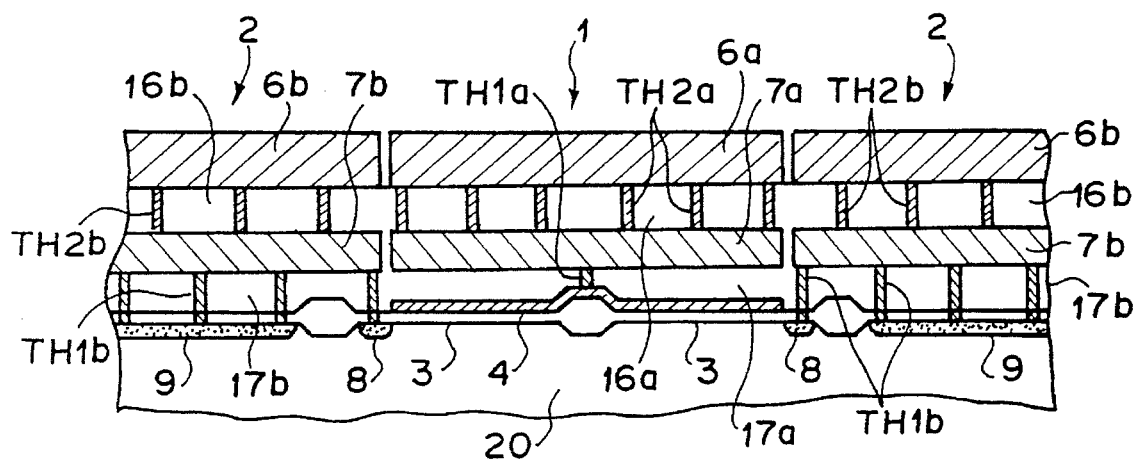
FIG. 4 is a cross-sectional view illustrating a specific embodiment of a power supply wiring according to the present invention.
Figure 5:
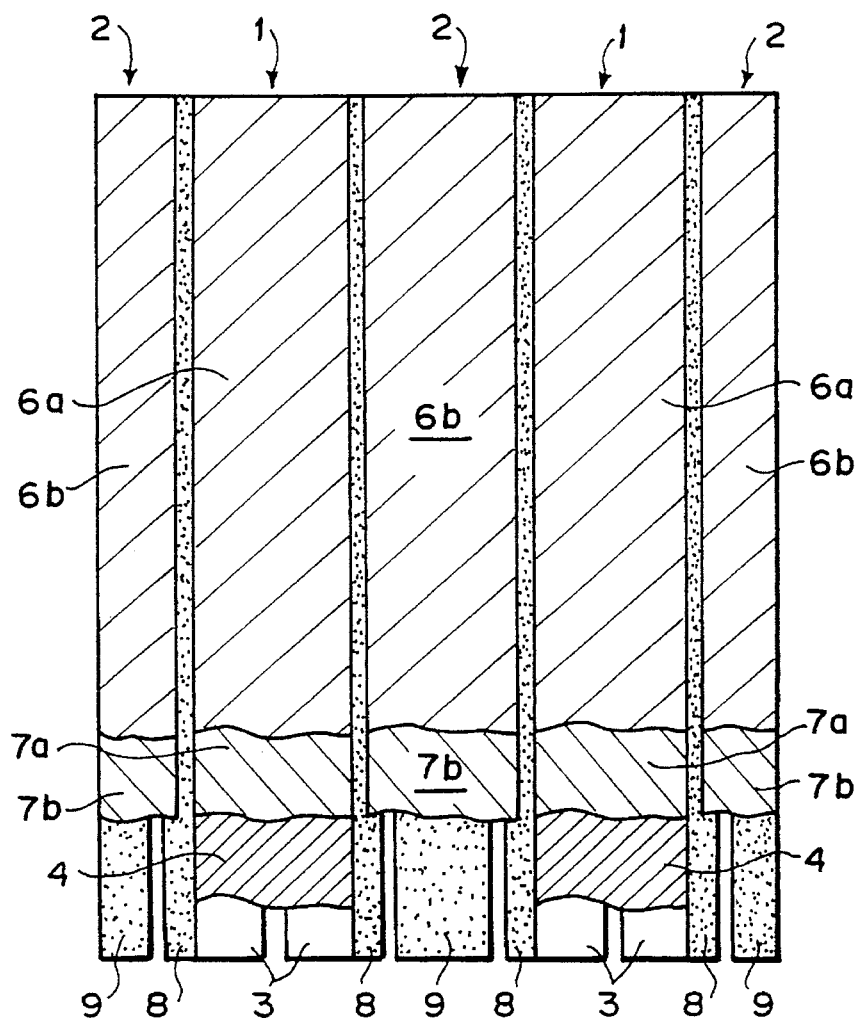
FIG. 5 is a partially cut-away plan view of FIG. 4.
Figure 6:
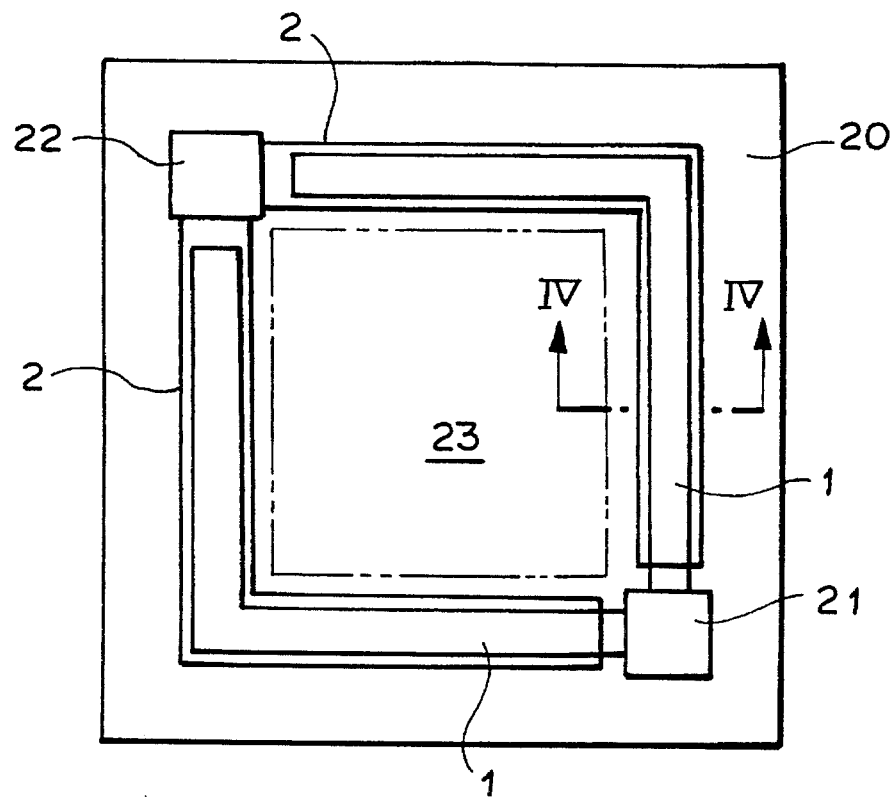
FIG. 6 is a schematic plan view illustrating a semiconductor integrated circuit device provided with a power supply wiring of FIG. 4.

FIG. 4 illustrates a cross-sectional view of a power supply wiring according to the present invention, FIG. 5 a partially cut-away plan view thereof and FIG. 6 a schematic plan view of a semiconductor integrated circuit device provided with such a power supply wiring. FIG. 4 corresponds to a cross-sectional view taken along line IV—IV of FIG. 6.

In FIG. 6, 20 denotes a p-type silicon substrate (chip), in which a CMOS integrated circuit is formed on the central area 23 of the surface. 21 denotes a bonding pad to be connected to the power supply potential, and 22 a bonding pad to be connected to the ground potential. A power supply line (first power supply line structure) 1 extends from the pad 21 up to the proximity of the pad 22 about the CMOS integrated circuit area 23. A ground line (second power supply line structure) 2 extends from the pad 22 up to the proximity of the pad 21 about the CMOS integrated circuit area 23.

As illustrated in FIG. 4, ground lines 2, 2 are disposed so as to sandwich the power supply line 1. In each line structure, first metal layers 7a, 7b and second metal layers 6a, 6b are overlapped so as to lower the resistance. These first and second metal layers are made of, for example, aluminum or aluminum alloy. The thickness of these layers account for, for example, 0.5 through 2.0 μm. Further, 16a, 16b are each an insulating layer interleaved between the second metal layers 6a, 6b and the first metal layers 7a, 7b, and 17a, 17b are each an insulating layer disposed below the first metal layers 7a, 7b. These insulating layers are made of, for example, silicon oxide. The thickness of these insulating layers account for, for example, 0.5 through 2.0 μm.

A silicon oxide film (hereinafter referred to as "gate oxide film") 3 similar to the gate oxide film and an electrically conductive film (hereinafter referred to as "gate") 4 made of polysilicon or polycide, which is similar to the gate, are formed on a p-type silicon substrate 20 below the power supply line 1 according to a process similar to that of making an ordinary nMOS transistor. Here, a portion where the gate 4 does not overlap is provided below the ground line 2 outwardly of both ends of the gate oxide film of the power supply line 1 (that is, the edge portion of the power supply line 1 where it lies adjacent to the ground line 2), and an n-type area 8 is formed according to the process similar to that of making the source/drain area of the nMOS transistor. A p$^+$-type area 9 is formed over most part of the remainder of the silicon substrate 20 below the ground line 2.

Through holes TH1a are formed through the insulating layer 17a in order to make the first metal layer 7a and the gate 4 electrically interconnected. Through holes TH1b are formed through the insulating layer 17b and the gate oxide film in order to make the first metal layer 7b and the n-type area 8 or p+-type area 9 electrically interconnected. Through holes TH2a are formed through the insulating layer 16a in order to make the first metal layer 7a and the second metal layer 6a electrically interconnected. Through holes TH2b are formed through the insulating layer 16b in order to make the first metal layer 7b and the second metal layer 6b electrically interconnected.

Thus, the edge of the ground line 2 is connected to the n-type area 8, and most central part of the ground line 2 is connected to the p$^+$-type area 9. Interconnection of the ground line 2 and the p$^+$-type area 9 forms a substrate contact, which serves to stabilize the substrate potential. Since the potential of the gate 4 equals that of the power source, an inversion layer is formed on the surface of the substrate below the gate oxide film 3, which is opposed to the gate 4, and turns into the ground potential through the n-type area 8. Thus, by sandwiching the gate oxide film 3 between the gate 4 and the inversion layer, a bypass capacitor is formed.

Figure 7:
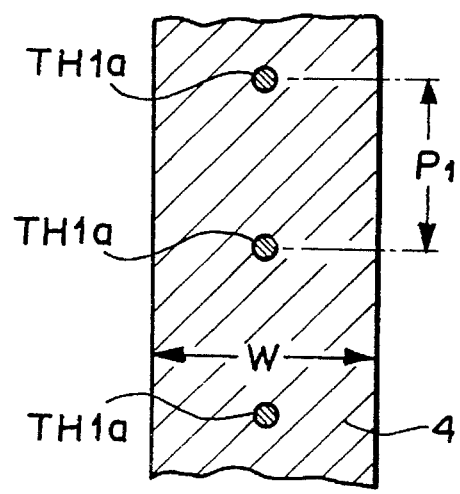
FIG. 7 is a partially cut-away, partial plan view of the embodiment of FIG. 4.

A shown in FIG. 7, through holes TH1a, TH1a, which are formed through the insulating layer 17a on the gate 4, are disposed at the central portion relative to the width direction of the gate 4, that is, in the width direction of the power supply line 1. The through holes TH1a, TH1a are disposed at a predetermined interval P$_1$ in the direction in which the power supply line 1 extends. This interval P$_1$ is smaller than the width of the gate 4, that is, the width W of the power supply line 1. Through holes TH2a, TH1b and TH2b are each disposed at an interval similar to one for the foregoing through holes TH1a.

The portion where the gate oxide film 3 and the gate 4 are overlapped lends itself to the creation of capacitance of the foregoing bypass capacitor and, hence, this capacitor will equal in length (the distance from the contact with the through hole TH1a up to the edge thereof) about a half of the width of the power supply line 1 and in width about the length of the power supply line 1. Since the inversion area also equals in length (the distance from the contact with the n-type area 8 up to the central portion thereof) about a half of the width of the power supply line 1 and in width about the length of the power supply line 1, the resistance will become small.

FIG. 5 is a view of the structure of FIG. 4 as viewed from above. If the power supply is not sufficient when a single power supply line 1 is sandwiched between two ground lines 2, 2, the power supply line 1 and the ground line 2 may be additionally alternately disposed to obtain a power supply wiring having a power supply similar to the power supply line 1 of large width, as shown in FIG. 5. In this case, the capacitance of the bypass capacitor may also be increased.

Although, in this figure, a large current can flow through a narrow width by overlapping the second metal layer and the first metal layer, as conventionally a power supply wiring structure comprising only the first metal layer or the second metal layer may be used. The case of the single first metal layer is obtained by removing the second metal layers 6a, 6b and through holes TH2a, TH2b of the insulating layers 16a, 16b in FIG. 4. In order to arrange the power supply wiring structure only with the second metal layer, a first metal layer will become necessary at the contact portion to be connected to the gate, n-type area and p$^+$-type area.

Since the thickness of the first and second metal layers is relatively thick and, further, the power supply wiring is laid out long, by making the interval between the power supply line 1 and the ground line 2 close to the minimum interval as desired (for example, 0.2 through 1.0 μm), capacitance may also directly be formed between the metal layer of the power supply line 1 and the metal layer of the ground line 2. This capacitor, which is disposed parallel to the capacitor comprised of the gate oxide film and the gate, serves to increase the capacitance.

Incidentally, although the foregoing embodiment was described with reference to the semiconductor device comprising the CMOS integrated circuit device, it is obvious that the present invention can be equally applied to the nMOS integrated circuit device or the pMOS integrated circuit device. In this case, the electrically conductive type of the semiconductor substrate and the areas formed thereon is set reverse to that of the foregoing embodiment, as necessary. For example, the area 8 of FIG. 4 may be set to the p-type and the area 9 may be changed into the n-type. In this case, the first power supply line is set to the low potential and the second power supply line is set to the high potential. Further, in the foregoing embodiment, although the second power supply line was chosen as the ground line, the second power supply line may be one which differs from the first power supply line and yet which applies the voltage other than the ground voltage.

As described above, if the semiconductor device comprises the MIS structure and especially the MOS structure, it is advantageous because the capacitance forming insulating film and the capacitance forming electrically conductive film of the power supply wiring can be made according to the process similar to that of making the circuit elements. However, the present invention may also be applied to the semiconductor devices other than the MIS structure devices.

The present invention should not be understood to be restricted to the foregoing embodiments, but includes all the embodiments following the technical ideas represented by the description of the claims.

What is claimed is:

1. Power supply wiring adapted for semiconductor device comprising:

at least one first power supply line structure and at least two second power supply line structures, which are disposed adjacent to both sides of said first power supply line structure;

said first power supply line structure comprising a capacitance forming insulating film formed on a semiconductor substrate, a capacitance forming electrically conductive film on said capacitance forming insulating film and a first power supply line formed on said capacitance forming electrically conductive film via a first insulating layer and electrically connected to said capacitance forming electrically conductive film through a plurality of through holes in said first insulating layer which are disposed, in a direction in which said first power supply line structure extends, at an interval smaller than substantially the same distance as the width of said first power supply line structure; and said second power supply line structures each comprising a second power supply line formed on said semiconductor substrate via a second insulating layer and electrically connected to said semiconductor substrate through a through hole in said second insulating layer.

2. Power supply wiring adapted for semiconductor device as set forth in claim 1, wherein a plurality of first power supply line structures and a plurality of second power supply line structures are alternately disposed.

3. Power supply wiring adapted for semiconductor device as set forth in claim 1, wherein said plurality of through holes of said first insulating layer are formed at the substantially central portion of said first power supply line structure relation to the width direction thereof.

4. Power supply wiring adapted for semiconductor device as set forth in claim 1, wherein said capacitance forming insulating film comprises silicon oxide.

5. Power supply wiring adapted for semiconductor device as set forth in claim 1, wherein said capacitance forming electrically conductive film comprises polysilicon or polycide.

6. Power supply wiring adapted for semiconductor device as set forth in claim 1, wherein said first and second insulating layers are made of silicon oxide.

7. Power supply wiring adapted for semiconductor device as set forth in claim 1, wherein said first and second power supply lines are made of metal.

8. Power supply wiring adapted for semiconductor device as set forth in claim 7, wherein said first and second power supply lines are made of aluminum or aluminum alloy.

9. Power supply wiring adapted for semiconductor device as set forth in claim 1, wherein each of said second power supply line structures includes a first electrically conductive type area formed on a surface portion of said semiconductor substrate, adjacent to said first power supply line structure, and said second power supply line is electrically connected to said first electrically conductive type area.

10. Power supply wiring adapted for semiconductor device as set forth in claim 9, wherein each of said second power supply line structures also includes a second electrically conductive type area formed on another surface potion of said semiconductor substrate, and said second power supply line is also electrically connected to said second electrically conductive type area.

11. Power supply wiring adapted for semiconductor device as set forth in claim 1, wherein said first and second power supply lines lie at the substantially same level and their adjacent lateral end portions are so close that they form a capacitance.

12. Power supply wiring adapted for semiconductor device comprising:

at least one first power supply line structure and at least two second power supply line structures, which are disposed adjacent to both sides of said first power supply line structure;

said first power supply line structure comprises a capacitance forming insulating film formed on a semiconductor substrate, a capacitance forming electrically conductive film on said capacitance forming insulating film and a first power supply line formed on said capacitance forming electrically conductive film via a first insulating layer said first power supply line including:

a first metal layer formed on said capacitance forming electrically conductive film via the first insulating layer and electrically connected to said capacitance forming electrically conductive film through a through hole in said first insulating layer; and a second metal layer formed on said first metal layer via a first additional insulating layer and electrically connected to said first metal layer through a through hole in said first additional insulating layer; and said second power supply line structures each comprise a second power supply line formed on said semiconductor substrate via a second insulating layer and electrically connected to said semiconductor substrate through a through hole in said second insulating layer.

13. Power supply wiring adapted for semiconductor device as set forth in claim 12, wherein a plurality of through holes of said first additional insulating layer are disposed at an interval substantially equal to that at which through holes of said first insulating layer are disposed.

14. Power supply wiring adapted for semiconductor device comprising:

at least one first power supply line structure and at least two second power supply line structures, which are disposed adjacent to both sides of said first power supply line structure;

said first power supply line structure comprises a capacitance forming insulating film formed on a semiconductor substrate, a capacitance forming electrically conductive film on said capacitance forming insulating film and a first power supply line formed on said capacitance forming electrically conductive film via a first insulating layer and electrically connected to said capacitance forming electrically conductive film through a through hole in said first insulating layer; and said second power supply line structures each comprises a second power supply line formed on said semiconductor substrate via a second insulating layer, said second power supply line includes:

a first metal layer formed on said semiconductor substrate via said second insulating layer and electrically connected to said semiconductor substrate through a through hole in said second insulating layer; and a second metal layer formed on said first metal layer via a second additional insulating layer and electrically connected to said first metal layer through a through hole in said second additional insulating layer.

15. Power supply wiring adapted for semiconductor integrated circuit device, comprising:

first and second power supply lines which are alternately disposed, a gate electrode and a gate insulating film formed below said first power supply line, said gate electrode being electrically connected to said first power supply line through a plurality of through holes in an insulating layer disposed between said gate electrode and said first power supply line, said through holes being disposed, in a direction in which said first power supply line extends, at an interval smaller than substantially the same distance as the width of said first power supply line, a first electrically conductive type area connected to said second power supply line formed at an area adjacent to said gate electrode below said second power supply line, a second electrically conductive type area connected to said second power supply line formed at another area, and a bypass capacitor formed between said first and second power supply lines.

16. Power supply wiring adapted for semiconductor integrated circuit device as set forth in claim 15, wherein the interval between said first power supply line and said second power supply line equals the minimum design dimension of a metal layer which is used for the power supply lines.

17. Power supply wiring as claimed in claim 15, wherein said first power supply line includes:

a first metal layer formed on said gate electrode via the insulating layer and electrically connected to said gate electrode through said through holes in said insulating layer; and a second metal layer formed on said first metal layer via an additional insulating layer and electrically connected to said first metal layer through a through hole in said additional insulating layer.

18. Power supply wiring as claimed in claim 15, wherein said second power supply line includes:

a first metal layer formed on an insulating layer and electrically connected to said first and second electrically conductive type areas through a through hole in said insulating layer on which said first metal layer is formed; and a second metal layer formed on said first metal layer via an additional insulating layer and electrically connected to said first metal layer through a through hole in said additional insulating layer.

19. Power supply wiring adapted for a semiconductor device comprising:

at least one first power supply line structure and at least two second power supply line structures, which are disposed adjacent to both sides of said first power supply line structure;

said first power supply line structure comprising a capacitance forming insulating film formed on a semiconductor substrate, a capacitance forming electrically conductive film on said capacitance forming insulating film and a first power supply line formed on said capacitance forming electrically conductive film via a first insulating layer and electrically connected to said capacitance forming electrically conductive film through a through hole in said first insulating layer; and said second power supply line structures each comprising a second power supply line formed on said semiconductor substrate via a second insulating layer and electrically connected to said semiconductor substrate through a through hole in said second insulating layer, wherein each of said second power supply line structures includes a first electrically conductive type area formed on a surface portion of said semiconductor substrate, adjacent to said first power supply line structure, said second power supply line is electrically connected to said first electrically conductive type area through said through hole in said second insulating layer, each of said second power supply line structures also includes a second electrically conductive type area formed on another surface portion of said semiconductor substrate, said second power supply line is also electrically connected to said second electrically conductive type area, and, said first electrically conductive type area is not extending to a surface portion of said semiconductor substrate which surface portion is in contact with said capacitance forming insulating film.

20. Power supply wiring adapted for semiconductor device as set forth in claim 19, wherein said semiconductor substrate is of a second electrically conductive type with an impurity concentration lower than that of said of second electrically conductive type area.

21. Power supply wiring adapted for semiconductor device as set forth in claim 19, wherein a plurality of first power supply line structures and a plurality of second power supply line structures are alternately disposed.

22. Power supply wiring adapted for semiconductor device as set forth in claim 19, wherein a plurality of through holes of said first insulating layer are formed at the substantially central portion of said first power supply line structure relative to the width direction thereof.

23. Power supply wiring adapted for semiconductor device as set forth in claim 19, wherein said through holes of said first insulating layer are disposed at an interval smaller than substantially the same distance as the width of said first power supply in structure in the direction in which said first power supply line structure extends.

24. Power supply wiring adapted for semiconductor device as set forth in claim 19, wherein said capacitance forming insulating film comprises silicon oxide.

25. Power supply wiring adapted for semiconductor device as set forth in claim 19, wherein said capacitance forming electrically conductive film comprises polysilicon or polycide.

26. Power supply wiring adapted for semiconductor device as set forth in claim 19, wherein said first and second insulating layers are made of silicon oxide.

27. Power supply wiring adapted for semiconductor device as set forth in claim 19, wherein said first and second power supply lines are made of metal.

28. Power supply wiring adapted for semiconductor device as set forth in claim 19, wherein said first and second power supply lines are made of aluminum or aluminum alloy.

29. Power supply wiring adapted for semiconductor device as set forth in claim 19, wherein said first power supply line includes a first metal layer formed on said capacitance forming electrically conductive film via the first insulating layer and electrically connected to said capacitance forming electrically conductive film through a through hole of said first insulating layer and a second metal layer formed on said first metal layer via a first additional insulating layer and electrically connected to said first metal layer through a through hole of said first additional insulating layer.

30. Power supply wiring adapted for semiconductor device as set forth in claim 19, wherein a plurality of through holes of said first additional insulating layer are disposed at an interval substantially equal to that at which through holes of said first insulating layer are disposed.

31. Power supply wiring adapted for semiconductor device as set forth in claim 19, wherein said second power supply line includes a first metal layer formed on said semiconductor substrate via said second insulating layer and electrically connected to said semiconductor substrate through said through hole of said second insulating layer and a second metal layer formed on said first metal layer via a second additional insulating layer and electrically connected to said first metal layer through a through hole of said second additional insulating layer.

32. Power supply wiring adapted for semiconductor device as set forth in claim 19, wherein said first and second power supply lines lie at the substantially same level and their adjacent lateral end portions are so close that they form a capacitance.

33. Power supply wiring adapted for semiconductor integrated circuit device, comprising:

first and second power supply lines which are alternately disposed, a gate electrode and a gate insulating film formed below said first power supply line, said gate electrode being electrically connected to said first power supply line, a first electrically conductive type area connected to said second power supply line formed at an area adjacent to said gate electrode below said second power supply line without extending to a portion below said gate insulating film, a second electrically conductive type area connected to said second power supply line formed at another area, and a bypass capacitor formed between said first and second power supply lines.

34. Power supply wiring adapted for semiconductor device as set forth in claim 33, wherein the interval between said first power supply line and said second power supply line equals the minimum design dimension of a metal layer which is used for the power supply lines.

* * * * *